United States Patent
Ohba

[11] Patent Number: 6,165,330
[45] Date of Patent: Dec. 26, 2000

[54] CONTINUOUS PLATING APPARATUS

[76] Inventor: Kazuo Ohba, 2-3, Matsubacho 4-chome, Higashimatsuyama-shi, Saitama, Japan

[21] Appl. No.: 09/209,573

[22] Filed: Dec. 11, 1998

[30] Foreign Application Priority Data

Sep. 25, 1998 [JP] Japan .................................. 10-271679

[51] Int. Cl.[7] .................................................. C25D 17/00
[52] U.S. Cl. ...................................... 204/198; 204/224 R
[58] Field of Search .................................... 204/198, 199, 204/224 R; 118/423, 424, 428

[56] References Cited

U.S. PATENT DOCUMENTS

| 4,401,522 | 8/1983 | Buschow et al. | 204/224 R X |
| 4,402,800 | 9/1983 | Ash et al. | 204/224 R X |
| 5,417,828 | 5/1995 | Sergio | 204/202 |

FOREIGN PATENT DOCUMENTS 10-273799  10/1998  Japan .

Primary Examiner—Donald R. Valentine
Attorney, Agent, or Firm—Flynn, Thiel, Boutell & Tanis, P.C.

[57] ABSTRACT

To quickly remove, away from a rail, an article which is subject to defects in the case where the feeding of the article to be delivered along the rail and plated is hindered, there is provided a continuous plating apparatus in which a planar article (3) to be plated is laid in a vertical direction on a rail (2) horizontally provided in a plating bath, and the article to be plated is clamped on both surfaces by rollers (5 and 17) fixed to vertical rotary shafts (4 and 10) and moved on and along the rail (2) to thereby plate the article (3), characterized in that an upper end side of each unit composed of the plurality of rotary shafts (10) is moved in a direction away from the article (3) to be plated. By only moving the upper ends of the rotary shafts (10) in the direction away from the articles (3) to be plated and by slanting the rotary shaft (10), the articles (3) having an inconvenience can be removed upwardly without removing the rotary shafts (10). It is possible to quickly return the rotary shafts (10) back to the original position and start the plating work again.

3 Claims, 3 Drawing Sheets

FIG. 3 (PRIOR ART)
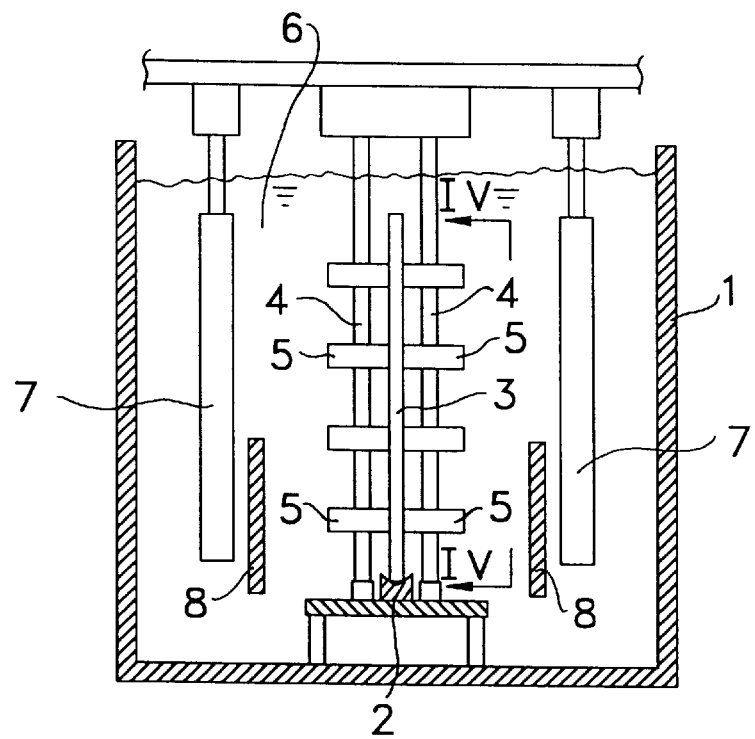
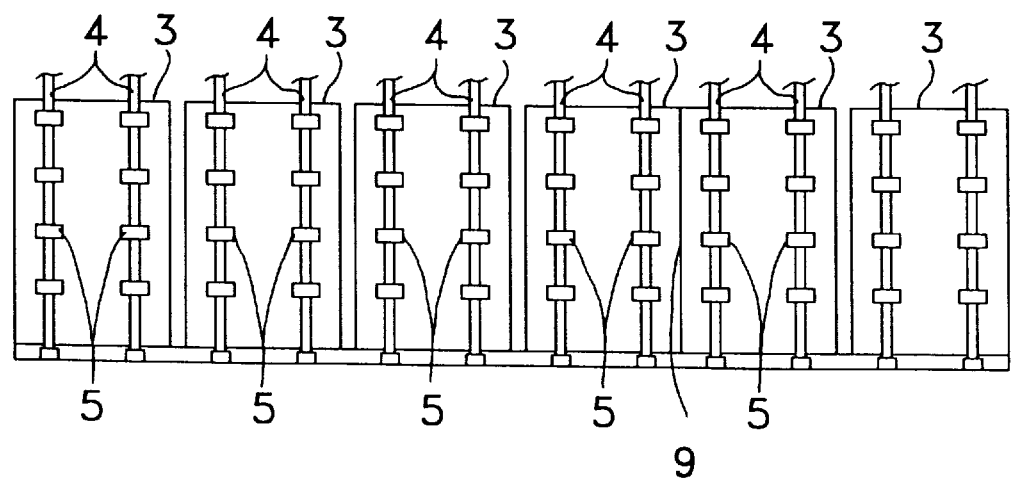
FIG. 4 (PRIOR ART)

CONTINUOUS PLATING APPARATUS

BACKGROUND OF THE INVENTION

1. Field of the Invention

The present invention relates to a continuous plating apparatus for continuously plating a planar article to be plated, which solves a trouble in a portion where there occurs a problem in a timely and suitable manner.

2. Description of the Related Art

Previously, the present inventor developed a continuous plating system for continuously feeding planar articles to be plated into a plating bath to thereby continuously and effectively plate them.

FIG. 3 is a longitudinal cross-sectional front view showing an example of the continuous plating apparatus. A V-shaped rail 2 extending in a vertical direction to the paper surface is provided in the vicinity of a central bottom of a plating bath 1. An article 3 to be plated such as a printed circuit board is held in the vertical direction with its lower edge being laid on the rail 2. Both surfaces of the article 3 to be plated are clamped by rollers 5 fixed to vertical rotary shafts 4 connected to cathodes. The rollers 5 are rotated together with the rotary shafts 4 so that the article 3 to be plated is moved on and along the rail 2 under the condition that the article is dipped in plating liquid 6.

Anodes 7 and shielding plates 8 for preventing turbulence are provided in the plating liquid 6. The current is caused to flow through the-article 3 to which a minus potential is applied to the rollers 5 from the rotary shafts 4 connected to the cathodes, thereby plating the article 3.

FIG. 4 is a side elevational view as viewed in the direction IV—IV of FIG. 3. The articles to be plated are fed one after another onto the rail 2 so that a large number of the articles are fed at a constant interval along the rail 2 to thereby perform the plating in a continuous and effective manner.

If the articles 3 to be plated and to be fed by the rotation of the rollers 5 are prevented from moving along the rail 2 due to certain accidents so that the interval between the articles 3 to be plated is decreased or an overlap 9 of the articles 3 to be plated takes place as shown in FIG. 4, there occurs an inconvenience of plating the articles to be plated. In particular, in the case where the overlap 9 of the articles 3 takes place, the planar articles 3 are bent or warped to become faulty articles.

In the case where the defects due to the feeding of the articles 3 to be plated take place, the rotation of the rotary shaft 4 is stopped, the rotary shafts 4 where the defects occur are removed one by one and the rollers 5 are removed together with the rotary shafts 4. The position of the articles 3 to be plated where the defects occur is corrected and the damaged articles 3 are removed away from the rail 2. Thereafter, the rotary shafts 4 are mounted again on the sides of the rail 2 together with the rollers 5.

This work is troublesome and takes a relatively long time. In the meantime, the large number of other articles within the plating bath 1 (see FIG. 3) are all defective products, which leads to a large economic damage, a delay of distribution of the products or similiar problems.

SUMMARY OF THE INVENTION

In order to solve the above-noted defects, an object of the present invention is to provide a continuous plating apparatus in which, in the case where the feed of the articles to be plated and to be delivered along the rail is hindered, the damaged articles may be quickly removed from the rail.

According to the present invention, there is provided a continuous plating apparatus in which a planar article to be plated is laid in a vertical direction on a rail horizontally provided in a plating bath, and the article to be plated is clamped on both surfaces by rollers fixed to vertical rotary shafts and moved on and along the rail to thereby plate the article, characterized in that an upper end side of each unit composed of the plurality of rotary shafts is moved in a direction away from the article to be plated. When there arises a problem in feeding the articles to be plated, only by moving the upper ends of the rotary shafts having such a problem in the direction away from the articles to be plated and by slanting the rotary shaft 10, the articles having such a problem can be removed upwardly without removing the rotary shafts. It is then possible to quickly return the rotary shafts to the original position and to start the plating work again. In order to constitute the unit by the plurality of rotary shafts, an interval that is somewhat longer than the dimension of the largest one of the articles to be delivered and plated is used as one unit, and the rotary shafts included in the interval are slanted together. Also, it is preferable that the angle of slant is in the range of 1 to 10 degrees.

BRIEF DESCRIPTION OF THE DRAWINGS

In the accompanying drawings:

FIG. 3 is a longitudinal cross-sectional front view showing an example of a conventional continuous plating apparatus; and FIG. 4 is a side elevational view as viewed from a direction of IV—IV of FIG. 3.

DESCRIPTION OF THE PREFERRED EMBODIMENTS

An embodiment of the present invention will now be described with reference to the accompanying drawings.

Figure 1:
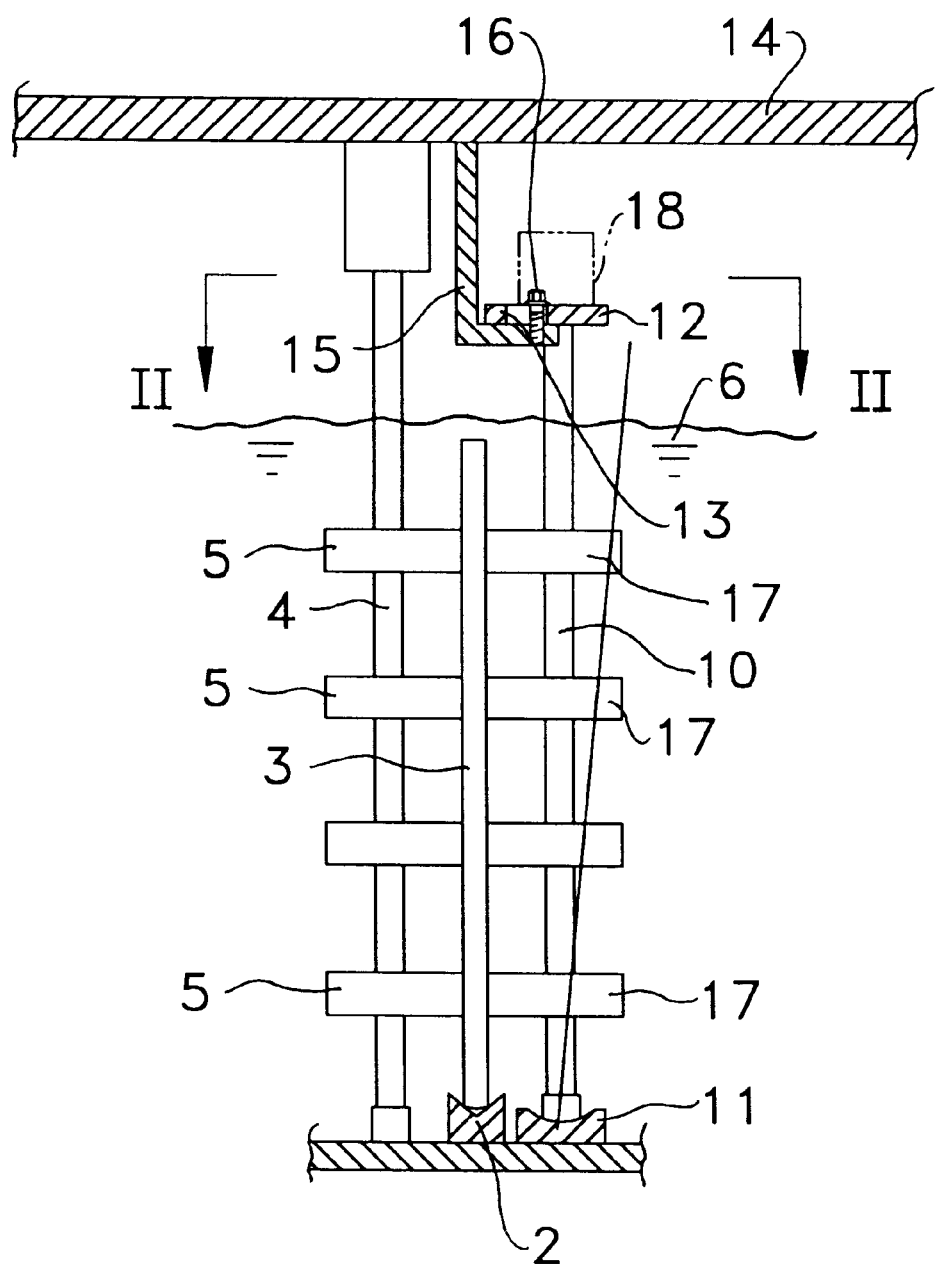
FIG. 1 is a longitudinal cross-sectional front view as viewed in a direction I—I of FIG. 2 showing one embodiment of the present invention.
Figure 2:
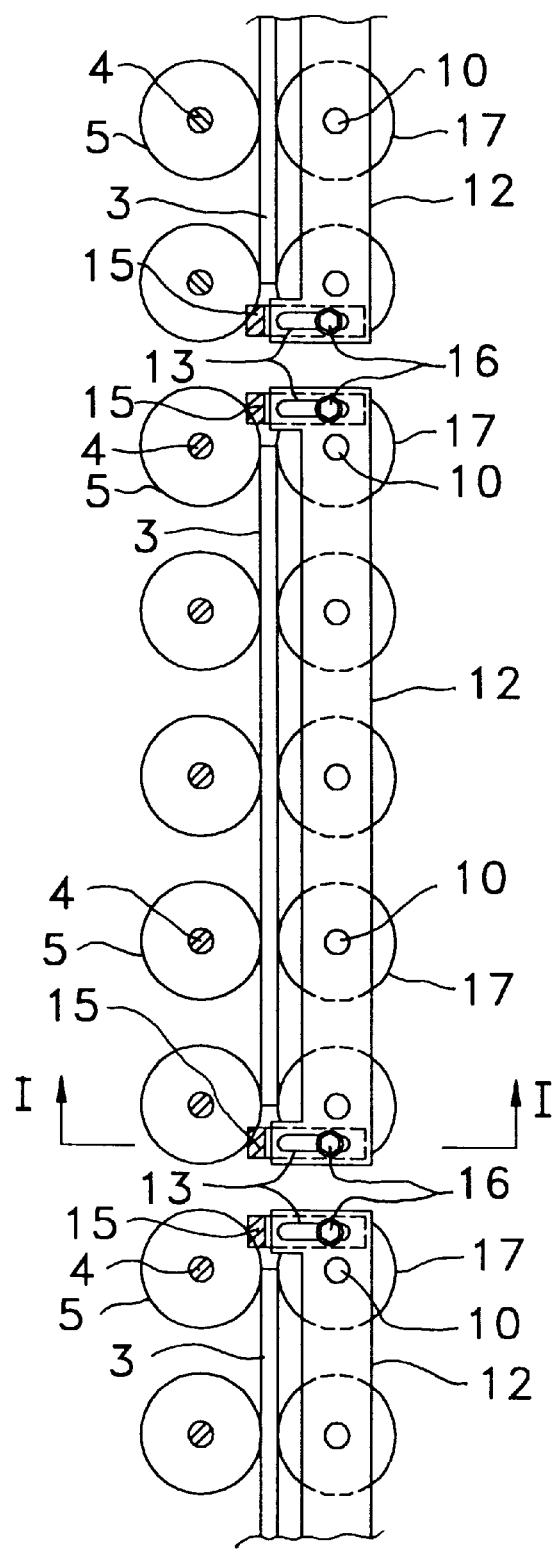
FIG. 2 is a plan view as viewed from a direction II—II of FIG. 1.

FIG. 1 is a longitudinal cross-sectional front view taken along the line I—I of FIG. 2 that shows an embodiment of the present invention. FIG. 2 is a plan view as viewed from the direction of II—II of FIG. 1. A rail 2 having a V-shaped cross-section and extending in the vertical direction to the paper surface in FIG. 1 is horizontally provided in the vicinity of the bottom of a plating bath 6. A lower edge of a planar article 3 to be plated such as a printed circuit board is laid on the rail 2 in the vertical direction. Rollers 5 fixed to vertical rotary shafts 4 connected to cathodes are in contact with left side surfaces of the article 3 in FIGS. 1 and 2.

Disposed on the right side of the article 3 shown in FIGS. 1 and 2 are vertical rotary shafts 10 in a symmetrical position with the above-described rotary shafts 4 about the article 3. The lower end of each rotary shaft 10 is supported rotatably on a support base 11 having a concave spherical surface as shown in FIG. 1. An upper end of each rotary shaft 10 is supported rotatably on a support plate 12.

As shown in FIG. 2, the support plate 12 rotatably supports the upper ends of the plurality of rotary shafts 10. Elongated slots 13 extending vertically to the surface of the article 3 to be plated are formed at both end portions of the support plate 12.

As shown in FIG. 1, each L-shaped holder plate 15 having a horizontal portion at the lower side thereof is fixed to a lower surface of a support beam 14 located above the plating liquid 6. Both end portions of the above-described support plate 12 are laid on the top surface of the horizontal portion of the holder plate 15. Then, stop screws 16 are screwed into the horizontal portions of the holder plates 15.

When the stop screws 16 are loosened, the support plate 12 may be moved along the elongated slot 13. The support plate 12 may be moved in a direction close to the rotary shafts 4 so that the rotary shafts 10 may be kept in a vertical posture as indicated by solid lines in FIG. 1, or the support plate 12 may be moved in a direction away from the rotary shaft 4 so that the rotary shafts 10 may be slanted with their upper ends being slanted in a direction away from the article 3 to be plated as indicated by two-dot and dash lines. In this case, the rotary shaft 10 are slanted about the support base 11 having the concave spherical surface. However, normally, under the condition that the rotary shaft 10 is kept in the vertical position, the stop screw 16 is fastened so that the support plate 12 is fixed to the horizontal portion of the holder plate 15.

Rollers 17 are fixed to the above-described rotary shaft 10 in positions corresponding to the rollers 5 fixed to the rotary shaft 4. Under the condition that the rotary shaft 10 takes the vertical posture, both surfaces of the planar article 3 with its lower end being laid on the rail 2 (see FIG. 1) are clamped by the rollers 5 and 17, to thereby hold the article 3 in the vertical direction.

A rotary drive device 18 is suitably mounted on the top surface of the support plate 12 as indicated by two-dot and dash lines in FIG. 1. The rotary shaft 10 is rotated at the same RPM as the rotary shaft 4 in the opposite direction. As a result, the article 3 clamped by the rollers 5 and 17 is moved on and along the rail 2 while the article 3 is keeping the vertical posture.

In FIG. 2, since the dimension of the article 3 in a longitudinal direction is 510 mm at maximum, the dimension of the support plate 12 in a longitudinal direction in parallel to the article 3 is about 600 mm, which is longer than the length of the article 3. Over the length of the support plate 12, five rotary shafts 10 are supported rotatably at an interval of about 100 mm. The interval of the rotary shafts 4 is the same as that of the rotary shafts 10.

The operation of the continuous plating apparatus shown in FIGS. 1 and 2 will now be described.

In the case where any hindrance takes place so that the interval of the articles 3 to be plated is extremely shortened or the overlap of the articles 3 to be plated takes place, the rotation of the rotary shafts 4 and 10 is stopped. The stop screws 16 fixed to both end portions of the support plate 12 located above the place where the hindrance against the feed takes place are loosened. When the support plate 12 is moved in the direction away from the article 3 along the elongated slots 13, the upper ends of the plurality (five in the embodiment shown in FIG. 2) of the rotary shafts 10 whose upper ends are rotatably supported to the support plate 12 are moved in the direction away from the article 3 together with the support plate 12 and slanted as indicated by the two-dot and dash lines in FIG. 1. The slant angle is about 3 degrees.

Thus, a gap whose upper portion is widened is formed between the rollers 5 and 17 which clamp the article 3 to be plated. Accordingly, after the position of the article 3 which is subjected to the hindrance against the feed is corrected, or the overlapped and damaged article 3 to be plated is removed upwardly, the support plate 12 is quickly moved in the direction close to the rotary shaft 4 so that the rotary shaft 10 is returned back to the vertical position as indicated by the solid lines in FIG. 1. Under the condition that the rotary shafts 10 take the vertical positions, the stop screws 16 are fastened. When the rotation of the rotary shafts 4 and 10 is started, the plating operation may be started again.

It is understood that the above-described embodiment shown in the drawings only shows one example and the invention is not limited thereto. It is possible for those skilled in the art to modify the embodiment within the scope of the appended claims and to take a variety of modifications.

According to the present invention, in the case where the hindrance against the feeding of the articles to be plated takes place in the continuous plating apparatus, it is unnecessary to remove the rotary shafts one by one in the place where the defects occur. Only by moving the upper ends of the rotary shafts in the direction away from the articles to be plated, it is possible to correct the positionings of the articles which are subjected to the defects and to remove the damaged articles upwardly. Thereafter, it is possible to quickly return the rotary shafts back to the original position. Accordingly, it is possible to easily correct, in a short time, the hindrance against the feeding of the articles to be plated and to suppress the trouble in plating to the minimum level.

What is claimed is:

1. A continuous plating apparatus for plating a planar article comprising: a plating tank; a plating bath provided in said plating tank; an anode; a cathode; a horizontally extending rail provided in a lower portion of the plating bath for supporting the planar article; a plurality of vertically extending rotary shafts provided on opposite sides of the rail; a plurality of rollers provided on each of the vertically extending rotary shafts, some of the rollers being electrically connected to the cathode; a support base provided at one side of the rail for rotatably supporting a lower end of the rotary shafts, and a support plate provided at an upper portion of said plating tank for securing an upper end of the rotary shafts which are rotatably supported by the support base, said support plate being movable in a direction to and away from the rotary shafts provided on the opposite side of the rail.

2. The continuous plating apparatus of claim 1, wherein said support base and rail are provided on a bottom wall of the plating tank.

3. The continuous plating apparatus of claim 1, wherein said support plate is secured to a holder plate and movable along a slot provided therein.

* * * * *